United States Patent [19]

Signorelli

[11] Patent Number: 4,490,672
[45] Date of Patent: Dec. 25, 1984

[54] BREAKWAY METER POINTERS AND SHAFTS

[76] Inventor: John A. Signorelli, 2150 E. 29th St., Brooklyn, N.Y. 11229

[21] Appl. No.: 429,667

[22] Filed: Sep. 30, 1982

[51] Int. Cl.³ .............................................. G01R 1/00
[52] U.S. Cl. ............................. 324/110; 324/154 PB; 116/319; 116/328; 340/568
[58] Field of Search ................ 116/328, 319; 324/110, 324/154 PB; 340/568

[56] References Cited

U.S. PATENT DOCUMENTS

| | | | |
|---|---|---|---|
| 660,021 | 8/1900 | Mordey et al. | 324/110 |
| 3,522,534 | 8/1970 | Mackenzie | 324/154 PB |
| 4,329,681 | 5/1982 | Parsons | 340/568 |
| 4,365,194 | 12/1982 | Halstead | 324/103 R |

*Primary Examiner*—Michael J. Tokar
*Attorney, Agent, or Firm*—Brooks, Haidt, Haffner & Delahunty

[57] ABSTRACT

A register pointer for an electric utility meter is described as having a weakened section at which fracture can occur to break away the pointer when an attempt is made to tamper with the pointer, such as by manually resetting the pointer's position on the register to show a lower reading of energy consumption. Various forms of breakaway means are described which will permit separation of the pointer portion of the device from its shaft portion when a torque is applied to the pointer end.

8 Claims, 13 Drawing Figures

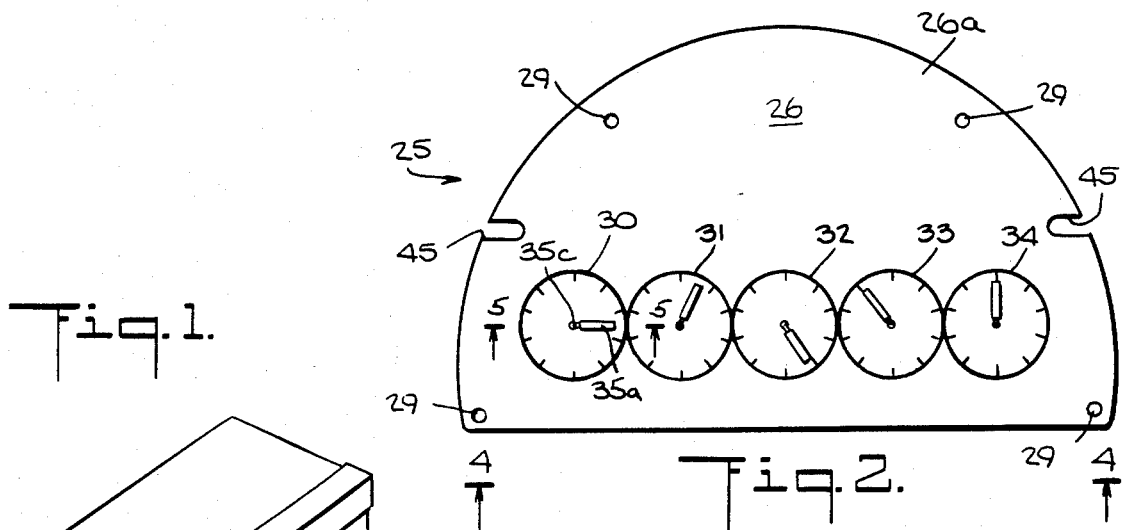
Fig. 1.
Fig. 2.
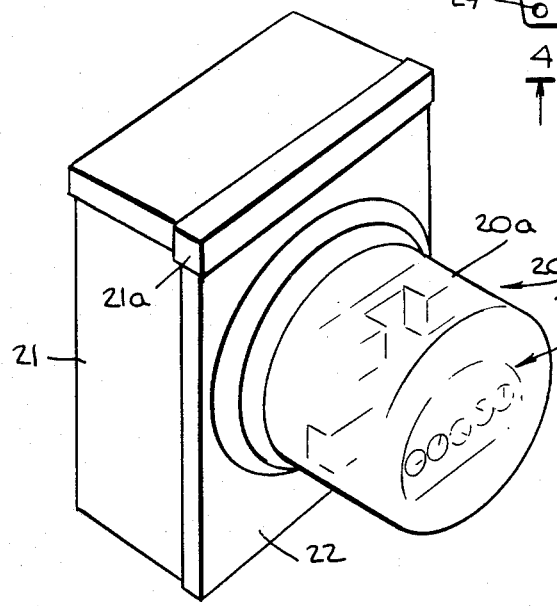
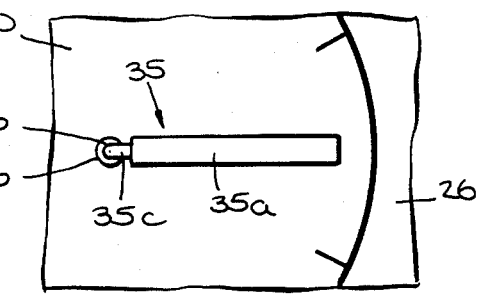
Fig. 3.
Fig. 4.
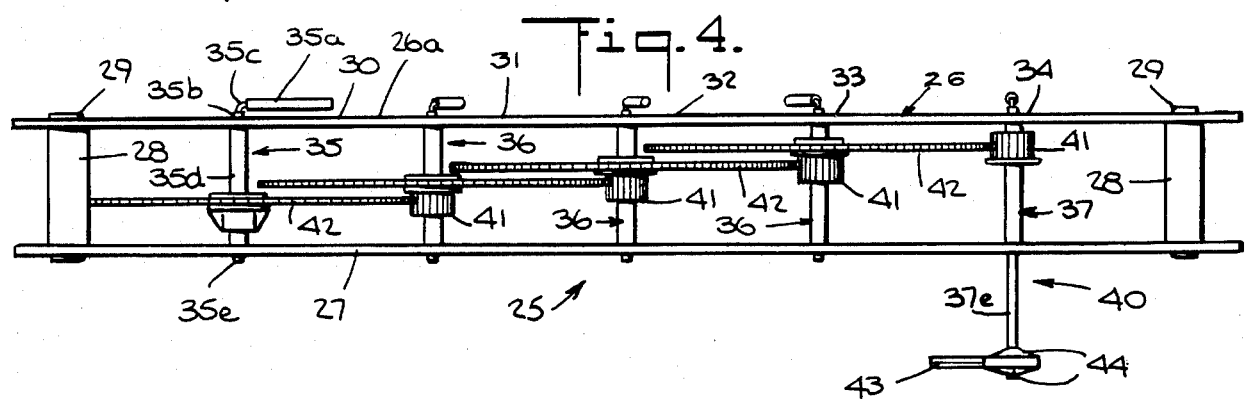
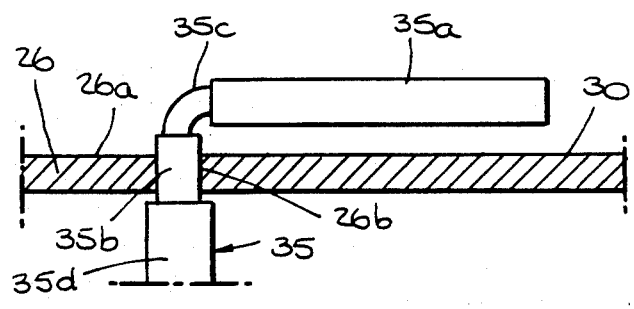
Fig. 5.

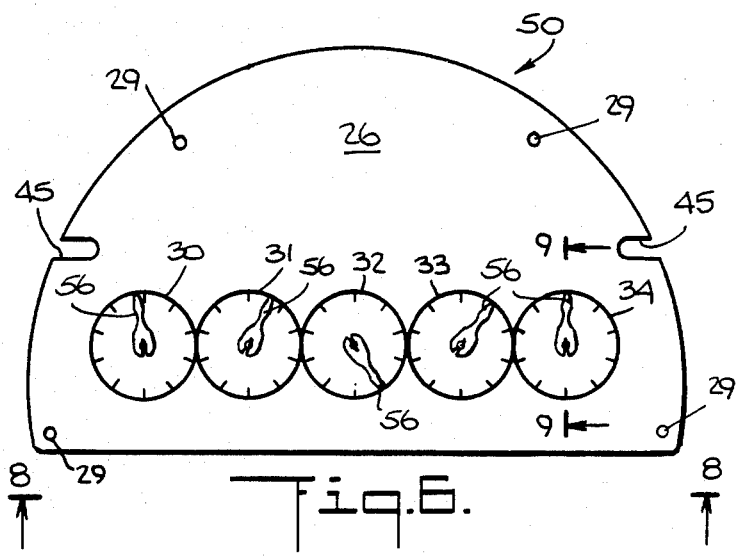
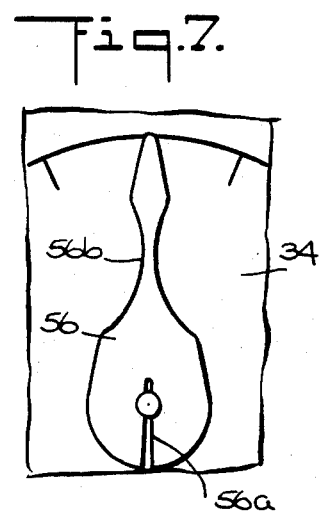
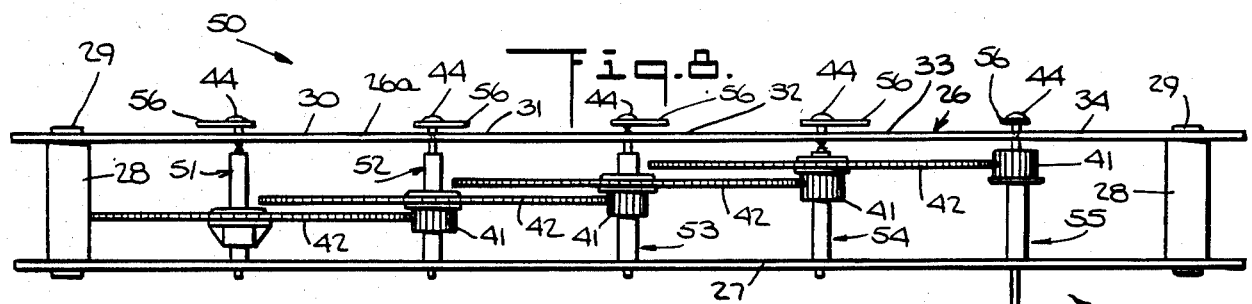
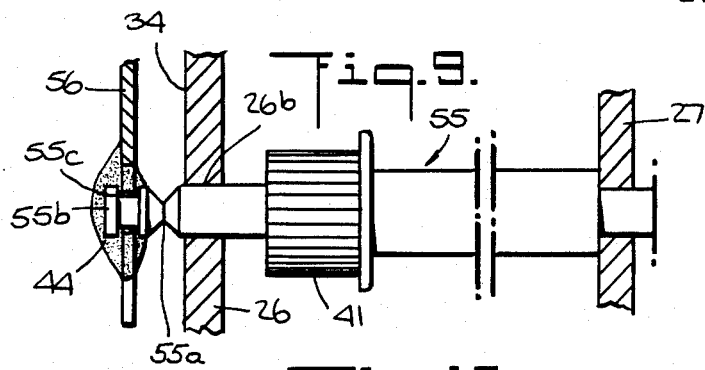
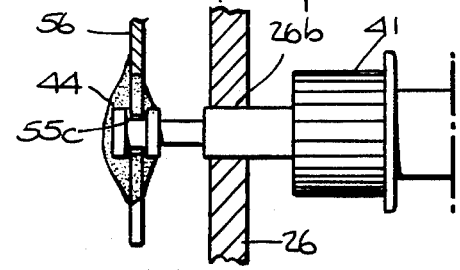
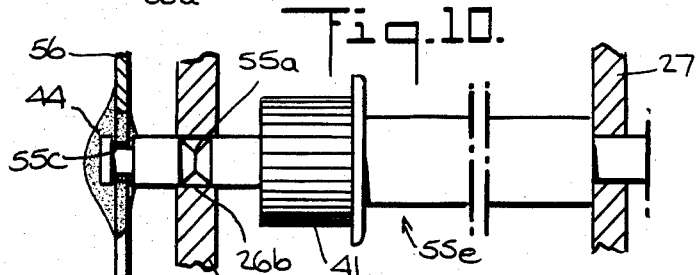
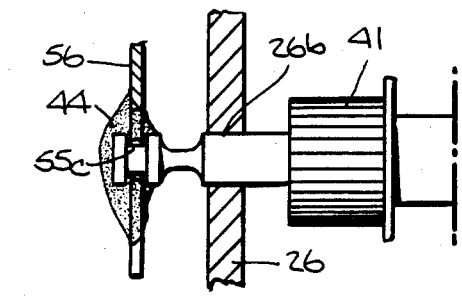
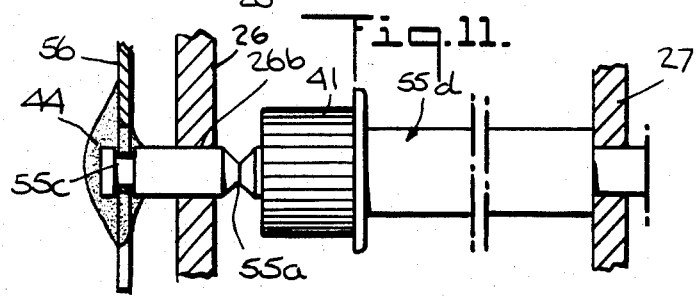

BREAKAWAY METER POINTERS AND SHAFTS

FIELD OF THE INVENTION

This invention relates to utility meters, such as electric and gas meters, and, more particularly, it relates to an improved device which will prevent meter pointers from being repositioned by customers.

BACKGROUND OF THE INVENTION AND THE PRIOR ART

Despite vigilance on the part of utility companies to prevent unauthorized access to the interior portion of electric meters, such as by use of a seal or lock device, as, for example, the locking apparatus of U.S. Pat. No. 4,313,319 issued to Haus, Jr. et al, it has been learned through sad experience that some utility customers have been persistent enough to gain access to the meter's internal mechanism, and they have surreptitiously repositioned the register pointers. Their actions cause the electric meter to falsely indicate a lower energy consumption and demand, and the utility company would accordingly bill the customer for the lower amount indicated.

In the past, register pointers of electric meters have been friction fitted to their respective shafts, because this practice permitted utility meter shops to quickly reset a register pointer reading to the zero-position by physically moving the pointer against its frictional grip with respect to the shaft, rather than use the time-consuming technique of mechanically resetting the pointers through operation of the register gear train mechanism. Of course, utility customers involved in meter tampering have learned how to reposition the pointers, and they have been resorting to that method so as to indicate a false reading of energy usage.

It has been determined that the simplest way to cheat the utility company is to turn back the register pointers. This method is also least likely to be detected. Whenever, for example, an electric meter has not been sealed, or the seal has been broken, a utility customer can then reset the register pointer by turning the pointer on its shaft against the friction-tight fit. The utility company either remains ignorant of this fact or the company is unable to prove that any cheating has occurred.

Breakaway meter pointers and shafts of the present invention can substantially stop this type of theft.

BRIEF DESCRIPTION OF THE INVENTION

The present invention contemplates that electric utility meter pointers, or a substantial portion thereof, will break away from the register if the pointer is turned manually. In addition, or as an alternative feature, when a conventional meter pointer is utilized but which is permanently fixed to the pointer shaft, the shaft can be provided with a necked-down area, or it can contain a region of frangible material, for breaking away in response to any attempt to manually turn the pointer.

Briefly and generally describing a breakaway meter pointer and shaft in accordance with a preferred form of the invention, a frangible shaft with integral pointer is provided having a weakened portion, such as an area of reduced diameter, which will fracture when torque is applied to the pointer end. Thus the pointer portion of the device will break off from the shaft portion and fall away from its corresponding dial on the register when an attempt is made to tamper with the meter reading.

In a modified form of the invention, a separate pointer is permanently affixed to its shaft, such as by use of a high technology glue, and the shaft can be turned down to produce a frangible point at which breakaway can occur. The invention contemplates the use of any of several modifications of the frangible point, including its location at various positions along the shaft length.

In another modified form of the invention, the pointer is formed of a material necked down to a frangible point susceptible to breaking off thereat when an attempt is made to reposition the pointer.

Accordingly, the long felt need for an effective antitamper device for electric utility meters as hereinbefore discussed is satisfied by the present invention.

DETAILED DESCRIPTION OF PREFERRED EMBODIMENTS

These and other objects, features, and advantages of the invention will be apparent from, and will be more fully understood when, the following detailed description of presently preferred embodiments thereof is read with reference to the accompanying drawings in which:

FIG. 1 is an isometric view of an electric meter mounted on a connection box, and having a meter register incorporating the present invention;

FIG. 2 is an enlarged frontal view of a meter register with breakaway pointers in accordance with the present invention;

FIG. 3 is an enlarged frontal view of a register pointer at the furthermost left-hand dial position of the meter register of FIG. 2;

FIG. 4 is an enlarged bottom view of the meter register of FIG. 2 as seen by looking in the direction of the arrows 4—4 of FIG. 2;

FIG. 5 is an enlarged side view of a register pointer at the furthermost left-hand dial position of the meter register of FIG. 2 as seen by looking in the direction of the arrows 5—5 of FIG. 2;

FIG. 6 is an enlarged frontal view of a meter register embodying a modified form of the present invention;

FIG. 7 is an enlarged frontal view of a register pointer at the furthermost right-hand dial position of the register meter of FIG. 6;

FIG. 8 is an enlarged bottom view of the meter register of FIG. 6 as seen by looking in the direction of the arrows 8—8 of FIG. 6;

FIG. 9 is an enlarged fragmentary side-sectional view of the meter register of FIG. 6 as seen by looking in the direction of the arrows 9—9 of FIG. 6;

FIG. 10 is an enlarged fragmentary side-sectional view of the meter register of FIG. 6, similar to FIG. 9, but showing a modified form of the present invention;

FIG. 11 is an enlarged fragmentary side-sectional view of the meter register of FIG. 6, similar to FIG. 9, but showing a further modified form of the present invention;

FIG. 12 is an enlarged fragmentary side-sectional view in part of the register meter of FIG. 6, somewhat similar to FIG. 9, but showing another modified form of the present invention; and FIG. 13 is an enlarged fragmentary side-sectional view in part of the register meter of FIG. 6, similar to FIG. 12, but showing yet another modified form of the present invention.

The invention will be described in conjunction with its use to prevent tampering of electric utility watthour meters, but it will be understood by those skilled in the art that the invention can also be likewise used in electric utility demand registers, and the invention may have other uses, such as to prevent tampering of gas and steam meters as well.

FIG. 1 illustrates a watthour meter 20 mounted in a conventional manner to a connection box 21 having a cover 22 which is slidably received at its upper end by a portion 21a of the connection box 21, and behind which the incoming electric power supply line (not shown) is connected across the watthour meter 20 to the consumer's equipment (not shown). A registering mechanism or register, generally indicated by reference numeral 25, of the watthour meter 20 is provided to indicate thereon the amount of energy consumed.

Referring to FIGS. 2 and 4 of the drawing, the register 25, incorporating the device of the present invention, has a semi-circular shaped front panel member 26 to which a similarly shaped rear panel member 27 is attached in spaced relation, as shown. The rear panel member 27 is positioned in such spaced axial relation, as illustrated in FIG. 4, by a plurality of spacing sleeves 28 through which suitable fasteners, such as rivets 29, are passed to permanently join together the front and rear panel members 26, 27.

Referring now to FIG. 2, there are a plurality of graduated dial faces 30–34 which are painted or etched onto the outer surface 26a of the front panel member 26, and on which the electric energy consumed in kilowatt hours is shown by pointers (to be described) and numerals (not shown). The dial face 30 at the furthermost left-hand position is generally considered to be the "most significant" dial face, because it shows the largest denominational reading on the ten thousandth order, whereas the dail face 34 at the extreme right-hand position is commonly referred to as the "least significant" dial face as it shows the smallest reading or a denominational reading in units.

With reference to FIG. 4, there is a pointer shaft member 35 at the "most significant" dial position 30, a pointer shaft member 36 at each of the dial positions 31–33, and a pointer shaft member 37 at the "least significant" dial position 34.

The pointer shaft member 35 is preferably of aluminum material and it is shown to have a pointer portion 35a, a shaft portion 35b, and a frangible portion 35c of reduced diameter which is positioned between the pointer and shaft portions respectively. Frangible portion 35c can be formed either by turning down the pointer shaft member 35 at that location shown in the drawing to be substantially adjacent the outer surface 26a of the front panel member 26, or it can be manufactured of another material, such as plastic, having a lower yield strength than aluminum, for example, and then glued or otherwise attached to respective ends, as shown, of the pointer portion 35a and the shaft portion 35b.

Referring now to FIG. 5, the register pointer is formed by bending over, at the frangible portion 35c, the pointer portion 35a from an initial position (not shown) axially aligned with the shaft portion 35b to its shown position (as installed) lying within a plane substantially perpendicular to a center line axis of the shaft portion 35b, and positioned within close proximity to the front panel member at a distance spaced therefrom on the order of 0.015" (15 thousandths inch) minimum.

Referring again to FIG. 4 and also FIG. 5, the pointer shaft 35 has a section of larger diameter, as compared to either of the aforementioned pointer shaft portions 35a–35c, which is indicated by reference numeral 35d, and which is positioned between the front panel member 26 and the rear panel member 27 of the register 25. The pointer shaft member 35 is rotatably mounted to the front panel member 26 by a closely slidable fit between the shaft portion 35b and a suitable front panel opening 26b which is centrally located with respect to the dial face 30, and the pointer shaft member 35 is rotatably mounted in likewise fashion to the rear panel member 27 at a shaft portion 35e, also of reduced diameter.

The pointer shaft members 36, 37 are substantially identical to the pointer shaft member 35, and it will be understood that the afornmentioned detailed description in connection with the pointer shaft member 35 will likewise apply to each of the other pointer shaft members. However, it is noted that a shaft portion 37e (somewhat equivalent to shaft portion 35e) extends further beyond the rear panel member 27 (see FIG. 4) than as perviously described with respect to portion 35e (far end) of the pointer shaft member 35. This shaft portion 37e serves as a drive shaft for a gear train mechanism of the register 25 as will be described.

In FIG. 4, a register gear train drive, generally referred to by reference numeral 40, comprises a series of pinions 41 and gears 42 which are pressed-on the pointer shaft members 35–37 in the manner shown. A pawl 43 cemented to the drive shaft 37e using, for example, a high technology glue or epoxy resin 44, is rotated by a fingered driving wheel (not shown) and imparts rotary motion (corresponding to use of electric energy) to the pointer shaft member 37 via the shaft portion 37e which in turn transfers this rotational motion through the pinion 41 mounted thereon to the meshed gear 42 on the pointer shaft member 36 for the dial face 33. Rotation of this pointer shaft member 36 causes its mounted pinion 41 to rotate in meshed relationship with the gear 42 on the next succeeding pointer shaft member 36 (for dial face 32), and this stepwise transfer of rotational motion continues accordingly to each of the next succeeding pointer shaft members until lastly reaching the pointer shaft member 35. Rotation of each pointer shaft member causes its respective pointer portion, such as at 35a, to rotate about the corresponding dial face from which a reading can be obtained to indicate an amount of electric energy then consumed in kilowatt hours.

As is generally known, the register 25 is in an inaccessible position within electric meter 20 as long as a meter cover 20a (see FIG. 1) has not been removed therefrom. However, if access to the register 25 (as installed) is gained, for example, in an attempt to tamper with the readings on the dials 30–34 (to show lower readings falsely corresponding to a lower amount of energy consumed), any attempt to turn back any one of the pointer members 35–37, as by gripping a shaft pointer and manually turning it back to another reading position, will result in breakaway of the pointer at its frangible portion, such as the portion 35c in FIG. 5.

Security fasteners (not shown) fit within the slots 45 of the front panel member 26 to permanently mount the register 25 on the watthour meter 20, so that the gear train driving pawl 43 cannot be reached and turned back to defeat the purpose of this invention. After installation, the head of each security fastener is sheared away with the application of additional torque, thus leaving behind a cone-shaped plug enclosed within a retainable collar. The collar prevents removal of the fastener and it also provides a visible means to indicate whether the fastener has been tampered with. The security fastener must be cut or drilled away to permit removal of the register from the meter.

Referring now to the embodiment of FIGS. 6-13, a register, generally indicated by reference numeral 50, is shown with previously referred to reference numerals, as used with respect to register 25, indicating like parts throughout.

The register 50 has a gear train drive 40 comprising a series of pinions 41 and gears 42 mounted, as shown in FIG. 8, on shafts 51-55 for the respective dial faces 30-34. The shafts 51-55 are preferably of aluminum material, and they are mounted to the front and rear panel members 26, 27 respectively, as previously described in connection with the pointer shafts 35-37.

Each shaft 51-55 is substantially identical to any one of the other shafts in that group, and in connection with the specification of this disclosure, further detailed description in respect thereto will be generally directed to the shaft 55. It will be understood that the following description in respect thereto will likewise apply where applicable, to each of shafts 51-54. With reference to FIG. 9, the shaft 55 has a frangible portion at 55a which is disposed in front of the front panel member 26 substantially adjacent to the dial face 34 to effect fracture development. The shaft 55 is shown to be necked-down to a frangible or fracture development point at 55a, which will permit breakaway of a near end portion 55b when an attempt is made to tamper with the reading on the dial face 34, as referred to above.

Referring now to FIGS. 7 and 9, a pointer 56 is mounted on the shaft 55 where it is cemented in place using, for example, high technology glue or epoxy resin 44. A slot 56a of the pointer 56 permits the pointer to be easily forced on the shaft end 55b to be seated in a groove 55c as shown prior to cementing (FIG. 7). The pointer 56 is provided with a necked-down region at 56b at which fracture development can occur again as previously described above.

FIG. 10 shows a modified version 55e of the shaft 55 with its frangible portion 55a now located substantially within the plane of the front panel member 26.

FIG. 11 shows yet another modified version 55d of the shaft 55 with its frangible portion 55a disposed between the front panel member 26 and the rear panel member 27, but substantially adjacent the front panel member 26.

FIGS. 12 and 13 show modified shapes of the necked-down or frangible portion 55a of shaft 55. The form shown in FIG. 12 is squared off with right angled corners whereas the form of FIG. 13 shows an arcuately necked-down shape.

Although preferred embodiments of the present invention have been described and illustrated, it will be apparent to those skilled in the art that various modifications may be made without departing from the principles of the invention.

What is claimed is:

1. A dial indicator device for a register of a utility meter comprising: an elongated member having a shaft portion and an indicator portion integrally connected to said shaft portion and generally disposed in a plane perpendicular thereto, the elongated member being slidably passed axially through a suitable opening of a front panel of said register which is adapted thereat to include dial means on an outer plane surface thereof, a far axial end of said elongated member being rotatably mounted at a rear panel of said register and a near axial end of the elongated member extending outwardly beyond said front register panel to include said integrally connected indicator portion, wherein the elongated member has fracture development means formed thereon whereby the indicator portion of the elongated member is separable from the shaft portion thereof when any attempt is made to manually rotate said indicator portion.

2. The dial indicator device of claim 1 wherein said fracture development means comprises a reduced cross-sectional portion of said elongated member disposed between said indicator and shaft portions thereof substantially adjacent said outer plane surface of the front register panel.

3. In a register for a utility meter comprising:
a front panel member;
a rear panel member mounted to and spaced axially from said front panel member;
dial face means attached to an outer plane surface of said front panel member;
at least one elongated pointer member;
an elongated shaft member passed axially through a central portion of said dial face means, the shaft member having a far end rotatably connected to said rear panel member and a near end being adapted to permanently receive said pointer member and to maintain the pointer member in spaced axial relationship with respect to said dial face means; and
drive means to mechanically rotate said shaft member;
wherein said shaft member has fracture development means to permit separation of a near end portion of the shaft member at a predetermined axial location thereon when an attempt is made to manually rotate the shaft member.

4. The register of claim 3 wherein said fracture development means comprises a reduced cross-sectional portion of said shaft member, and wherein said predetermined axial location where fracture will occur is disposed in front of said front panel member substantially adjacent to said dial face means.

5. The register of claim 3 wherein said fracture development means comprises a reduced cross-sectional portion of said shaft member, and wherein said predetermined axial location where fracture will occur is disposed substantially in a plane of said front panel member.

6. The register of claim 3 wherein said fracture development means comprises a reduced cross-sectional portion of said shaft member, and wherein said predetermined axial location where fracture will occur is disposed between said front and rear panel members substantially adjacent to the front panel member.

7. In a register for a utility meter comprising:
a front panel member;
a rear panel member mounted to and spaced axially from said front panel member;
dial face means attached to an outer plane surface of said front panel member;
at least one elongated pointer member having a free end and a mounting end;
an elongated shaft member passed axially through a central portion of said dial face means, the shaft member having a far end rotatably connected to said rear panel member and a near end being adapted to permanently receive said pointer member at its said mounting end and to maintain the pointer member in spaced axial relationship with respect to said dial face means; and drive means to mechanically rotate said shaft member and said pointer member;

wherein said pointer member has fracture development means to permit separation of a free end portion of the pointer member when an attempt is made to manually rotate the pointer member.

8. The register of claim 7 wherein said fracture development means comprises a reduced cross-sectional portion of said pointer member at a location substantially spaced axially from the pointer member's said free end.

* * * * *